US011961798B2

(12) United States Patent
Wu

(10) Patent No.: US 11,961,798 B2
(45) Date of Patent: Apr. 16, 2024

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei (CN)

(72) Inventor: Ping-Heng Wu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 246 days.

(21) Appl. No.: 17/470,007

(22) Filed: Sep. 9, 2021

(65) Prior Publication Data

US 2022/0084934 A1  Mar. 17, 2022

Related U.S. Application Data

(63) Continuation of application No. PCT/CN2021/103897, filed on Jun. 30, 2021.

(30) Foreign Application Priority Data

Sep. 11, 2020 (CN) .................. 202010955528.X

(51) Int. Cl.
  *H01L 23/522* (2006.01)
  *H01L 49/02* (2006.01)
(52) U.S. Cl.
  CPC .......... *H01L 23/5222* (2013.01); *H01L 28/75* (2013.01)

(58) Field of Classification Search
  CPC ................ H01L 28/75; H01L 23/5222; H01L 23/523295; H01L 23/53204; H01L 23/53266
  See application file for complete search history.

(56) References Cited

U.S. PATENT DOCUMENTS

| 5,792,706 A | 8/1998 | Michael |
| 5,798,559 A | 8/1998 | Bothra |
| 6,211,561 B1 | 4/2001 | Zhao |
| 10,818,600 B2 | 10/2020 | Lu et al. |
| 2003/0146513 A1* | 8/2003 | Ireland ................ H01L 21/7682 438/622 |
| 2016/0225716 A1 | 8/2016 | Lu et al. |
| 2017/0178949 A1* | 6/2017 | Nguyen .............. H01L 23/5222 |
| 2019/0371736 A1* | 12/2019 | Singh ................ H01L 23/53228 |

FOREIGN PATENT DOCUMENTS

CN  102637628 A  8/2012

* cited by examiner

*Primary Examiner* — Thanhha S Pham
(74) *Attorney, Agent, or Firm* — Cooper Legal Group, LLC

(57) ABSTRACT

A semiconductor structure and a method for manufacturing a semiconductor structure are provided. The semiconductor structure includes at least two electrode layers, and the electrode layers are parallel to each other and arranged in different layers. Adjacent electrode layers overlap with each other and have an overlapping area, a dielectric layer is arranged between the adjacent electrode layers, and an air gap is arranged in the dielectric layer located in the overlapping area.

15 Claims, 24 Drawing Sheets

SEMICONDUCTOR STRUCTURE AND METHOD FOR MANUFACTURING SEMICONDUCTOR STRUCTURE

CROSS-REFERENCE TO RELATED APPLICATIONS

This application is a continuation application of International Patent Application No. PCT/CN2021/103897, filed on Jun. 30, 2021, entitled "Semiconductor Structure and Method for Manufacturing Semiconductor Structure", which claims priority to Chinese patent application No. 202010955528.X, filed to the China National Intellectual Property Administration on Sep. 11, 2020 and entitled "Semiconductor Structure and Method for Manufacturing Semiconductor Structure". The contents of International Patent Application No. PCT/CN2021/103897 and Chinese Patent Application No. 202010955528.X are hereby incorporated by reference in their entireties.

TECHNICAL FIELD

This application relates to the field of semiconductor, in particular to a semiconductor structure and a method for manufacturing a semiconductor structure.

BACKGROUND

With the continuous development of the semiconductor manufacturing process, the semiconductor structure is developing towards miniaturization and integration, so that a vertical distance between metal layers arranged in the semiconductor structure is accordingly reduced. When the adjacent metal layers overlap with each other and have an overlapping area, and an interlayer dielectric layer is arranged between the adjacent metal layers, stray capacitance may be formed between the adjacent metal layers. The existence of the stray capacitance may lead to signal delay, which reduces the performance of the semiconductor structure.

In the related art, the capacitance value of the stray capacitance is reduced generally by increasing the distance between the metal layers opposite to each other. However, the abovementioned manner may increase the dimension (such as the thickness) of the semiconductor structure, which is not conducive to the miniaturization and integration of the semiconductor structure.

SUMMARY

In view of the abovementioned problem, embodiments of this application provide a semiconductor structure and a method for manufacturing a semiconductor structure.

According to a first aspect, embodiments of this application provide a semiconductor structure, including at least two electrode layers. The electrode layers are parallel to each other and arranged in different layers. Adjacent electrode layers overlap with each other and have an overlapping area, a dielectric layer is arranged between the adjacent electrode layers, and an air gap is arranged in the dielectric layer located in the overlapping area.

According to a second aspect, embodiments of this application provide a method for manufacturing a semiconductor structure, including the following operations.

An electrode layer is provided.

A dielectric layer is formed. The dielectric layer covers the electrode layer, and an air gap is arranged in the dielectric layer.

Another electrode layer located on the dielectric layer is formed. Two electrode layers are parallel to each other, and the two electrode layers overlap with each other and have an overlapping area. The air gap is arranged in the dielectric layer located in the overlapping area.

DETAILED DESCRIPTION

Figure 1:
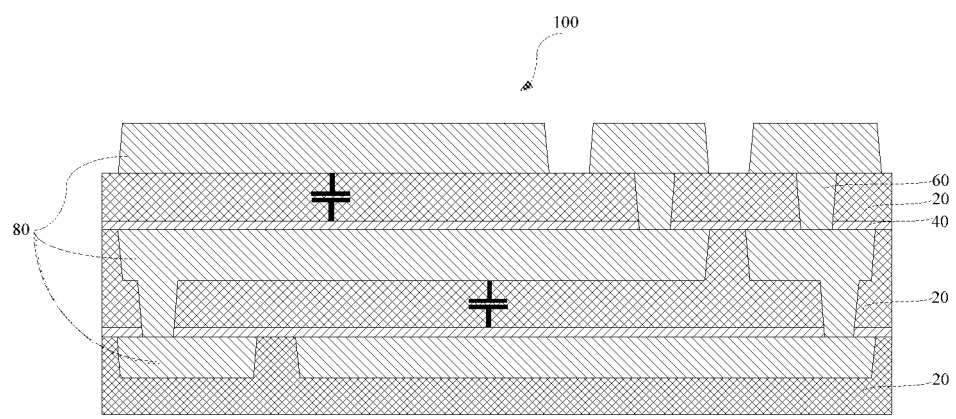
FIG. 1 is a schematic diagram of a semiconductor structure in a related art.

In the actual work, the inventor of this application has found, as shown in FIG. 1, if the dimension (such as thickness) of a semiconductor structure is small, a vertical distance between metal layers 80 in the semiconductor structure 100 will be accordingly reduced. In view of the fact that the adjacent metal layers 80 are interval arranged along a vertical direction by an interlayer dielectric layer, stray capacitance may be formed between the adjacent metal layers, and the stray capacitance may lead to signal delay of the semiconductor structure, which reduces the performance of the semiconductor structure.

For the abovementioned technical problem, embodiments of this application provide a semiconductor structure and a method for manufacturing a semiconductor structure. An air gap is arranged at a part in the dielectric layer corresponding to an overlapping area, and a dielectric constant of the air gap is less than a dielectric constant of the dielectric layer, so that the stray capacitance between the two electrode layers having the overlapping area is reduced, thereby reducing the signal delay of the semiconductor structure and improving the performance of the semiconductor structure.

In order to make the abovementioned objects, features and advantages of the embodiments of this application more apparent and understandable, the technical solution in the embodiments of this application will be clearly and completely described below in combination with the drawings in the embodiments of this application. It is apparent that the described embodiments are only a part of the embodiments of this application but not all. Based on the embodiments of this application, all the other embodiments obtained by those of ordinary skill in the art without contributing creative effort should belong to the protection scope of this application.

First Embodiment

Figure 2:
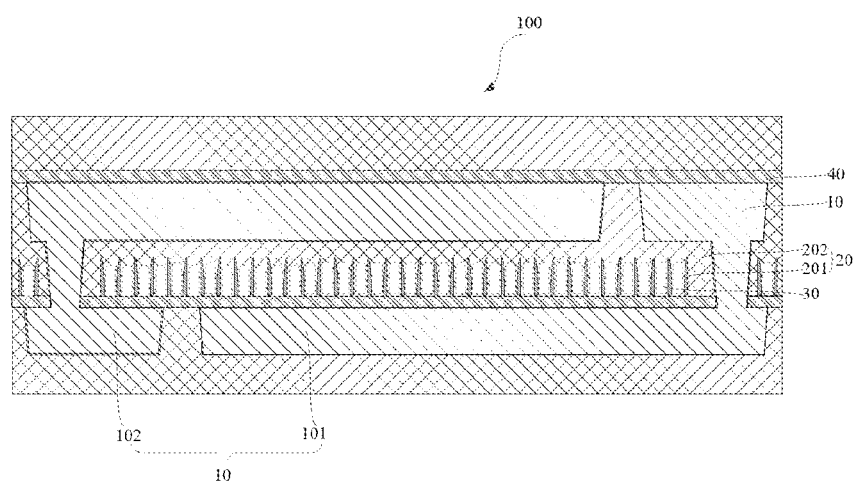
FIG. 2 is a first schematic diagram of a semiconductor structure according to a first embodiment of this application.
Figure 3:
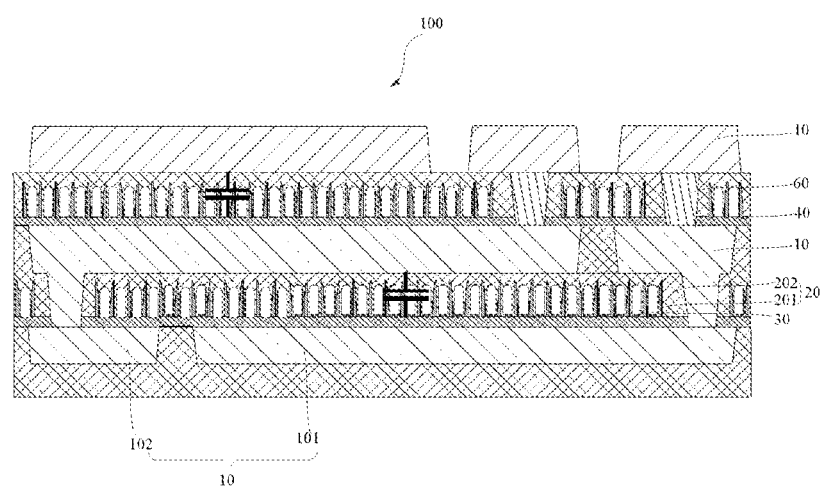
FIG. 3 is a second schematic diagram of a semiconductor structure according to the first embodiment of this application.

As shown in FIG. 2 and FIG. 3, embodiments of this application provide a semiconductor structure 100 including at least two electrode layers 10. The electrode layers 10 are parallel to each other and arranged in different layers. Adjacent electrode layers 10 overlap with each other and have an overlapping area. A dielectric layer 20 is arranged between the adjacent electrode layers 10. An air gap 30 is arranged in the dielectric layer 20 located in the overlapping area, and a dielectric constant of the air gap 30 is less than a dielectric constant of the dielectric layer 20.

The semiconductor structure 100 provided by this embodiment may be a transistor, a memory or a metal wire. For example, when the semiconductor structure 100 is the transistor, the two electrode layers 10 arranged in different layers may be a M1 metal layer and a M2 metal layer, or the M2 metal layer and a M3 metal layer in TFT layer. For example, when the semiconductor structure 100 is the memory, one electrode layer 10 may be one polar plate of a capacitor in the memory, the other electrode layer 10 may be another metal layer in the memory, and the metal layer is arranged opposite to one polar plate of the capacitor. Or, the two electrode layers 10 are respectively a bit line and a word line that are arranged on a base of the memory.

The adjacent electrode layers 10 overlap with each other and have the overlapping area. When different voltages are applied to the two electrode layers 10, the stray capacitance may be formed between the overlapping areas of the two electrode layers 10. The stray capacitance may lead to the signal delay of the semiconductor structure 100, which reduces the performance of the semiconductor structure 100. Therefore, in this embodiment, the dielectric layer 20 is arranged between the adjacent electrode layers 10, and the air gap 30 is arranged in the area in the dielectric layer 20 corresponding to the overlapping area. That is to say, the air gap 30 is arranged in the dielectric layer 20 capable of forming the stray capacitance in the semiconductor structure 100, and the air gap 30 may be an air gap. Since the dielectric constant of the air is less than the dielectric constant of the dielectric layer 20, the capacitance value of the stray capacitance can be reduced, thereby reducing the signal delay of the semiconductor structure 100 and improving the performance of the semiconductor structure 100. Herein, the material of the dielectric layer 20 is silicon nitride or silicon oxide.

In this embodiment, the adjacent electrode layers 10 overlap with each other and have the overlapping area, which may be understood to mean that a protection of one electrode layer 10 in the other electrode layer 10 is completely coincided with or partially coincided with the other electrode layer 10. In addition, there are multiple choices for the number of the electrode layers 10 in the semiconductor structure 100. For example, as shown in FIG. 2, the semiconductor structure 100 includes two electrode layers 10. For example, as shown in FIG. 3, the semiconductor structure 100 includes three electrode layers 10 that are interval arranged from bottom to top, and a dielectric layer 20 is arranged between each two adjacent electrode layers 10.

In some embodiments, the dielectric layer 20 may include at least one annular side wall 201 and a filling layer 202 covering the annular side wall 201. Herein, the dielectric layer 20 may be directly or indirectly in contact with the electrode layers 10. For example, a barrier layer 40 is arranged between the dielectric layer 20 and the electrode layer 10, the barrier layer 40 may increase the binding force between the dielectric layer 20 and the electrode layer 10. Accordingly, the annular side wall 201 may be arranged on the barrier layer 40.

Herein, the material of the annular side wall 201 may be the same as or different from the material of the filling layer 202. For example, the material of the annular side wall 201 is the same as the material of the filling layer 202 and is one or more of silicon oxide, silicon nitride, silicon carbon oxide or silicon carbon nitride, thereby increasing the binding force between the annular side wall 201 and the filling layer 202 and preventing the annular side wall 201 from being separated from the filling layer 202.

The annular side wall 201 protrudes from an upper surface of the electrode layer 10 or an upper surface of the barrier layer 40, and an area enclosed by the annular side wall 201 and an area between the adjacent annular side walls 201 are grooves with a certain depth. When the material of the filling layer 202 is deposited on the electrode layer 10, that is to say, when silicon nitride, silicon oxide, silicon oxynitride or other insulation materials are deposited on the electrode layer 10, the material of the filling layer 202 may be deposited in the area enclosed by the annular side wall 201 and the area between the adjacent annular side walls 201. Since the space formed in the annular side wall 201 and the groove formed between the adjacent annular side walls 201 are deeper, and/or, the space formed in the annular side wall 201 and the groove formed between the adjacent annular side walls 201 have smaller dimension, blank areas may be formed in the area enclosed by the annular side wall 201 and the area between the adjacent annular side walls 201. The filling layer is sealed at an end of the annular side wall 201 away from the electrode layer 10 by controlling the deposition rate, the temperature and the air flow of a deposition device, so that the filling layer 202 located in each annular side wall and the filling layer 202 located between the adjacent annular side walls 201 have the air gap, and the air gaps form the air gap 30.

In the embodiments of this application, a plurality of air gaps 30 interval arranged are arranged in the dielectric layer 20. The dielectric constant of the air gap 30 is less than the dielectric constant of the dielectric layer 20, so that the dielectric constant of the dielectric layer 20 can be reduced, which in turn reduces the capacitance value of the stray capacitance, reduces the signal delay of the semiconductor structure 100, and improves the performance of the semiconductor structure 100.

In some embodiments, the annular side wall 201 includes a plurality of elongated rings extending along a first direction, and the plurality of elongated rings are interval arranged along a second direction to form a rectangular pattern. Herein, the first direction is perpendicular to the second direction.

Figure 4:
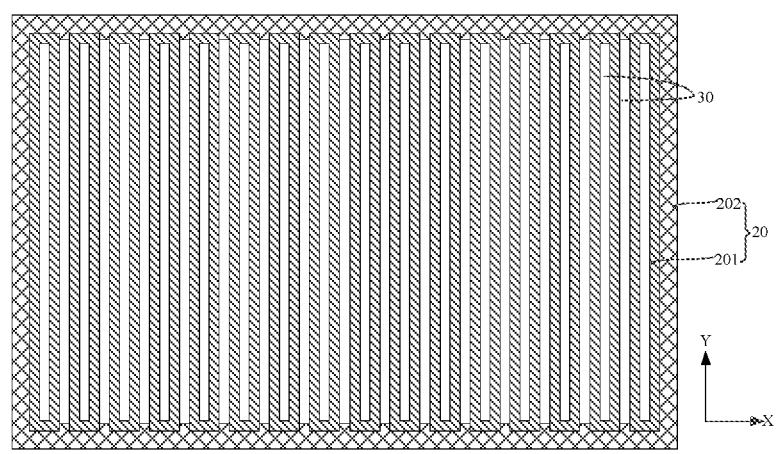
FIG. 4 is a first distribution diagram of a dielectric layer and an air gap according to the first embodiment of this application.

Taking that the electrode layer 10 or the barrier layer 40 is rectangular as an example, the shape of the dielectric layer 20 is also rectangular. The first direction may be a width direction of the electrode layer 10, namely, a Y direction in FIG. 4, and the second direction is a length direction of the electrode layer 10, namely, an X direction in FIG. 4.

Herein, the length direction of the elongated rings is consistent with the first direction, that is to say, the length direction of the elongated rings is consistent with the width direction of the electrode layer 10 or the barrier layer 40. Furthermore, the elongated rings also have a certain height, and a height direction of the elongated rings is perpendicular to the plane where the electrode layer 10 is located. That is to say, the height direction of the elongated rings is a direction perpendicular to the electrode layer 10.

In this embodiment, the annular side wall 201 is designed as the elongated ring, so that the space in the annular side wall 201 and the space between the adjacent annular side walls 201 are regular shapes, which facilitates controlling formation positions of the air gaps. When the material of the filling layer 202 is deposited on the electrode layer 10, the material of the filling layer 202 is covered on the elongated rings and covered at the inner sides, the bottoms and the outer sides of the elongated rings and the electrode layer 10 located between the adjacent elongated rings, and the filling layer 202 located in each elongated ring and the filling layer 202 located between the adjacent elongated rings have the air gap 30, so that the dielectric constant of the dielectric layer 20 may be reduced, thereby reducing the capacitance value of the stray capacitance, reducing the signal delay of the semiconductor structure 100 and improving the performance of the semiconductor structure 100.

In some embodiments, the annular side wall 201 includes a circular ring, and a central line of each of a plurality of circular rings is perpendicular to the electrode layers 10. For example, when the electrode layer 10 is horizontally arranged, the central line of each of the plurality of circular rings is parallel to a vertical direction.

Taking that the electrode layer 10 or the barrier layer 40 is rectangular, and the electrode layer 10 and the barrier layer 40 are horizontally arranged as an example, the vertical direction in this embodiment refers to the direction perpendicular to the plane where the electrode layer 10 is located.

Figure 5:
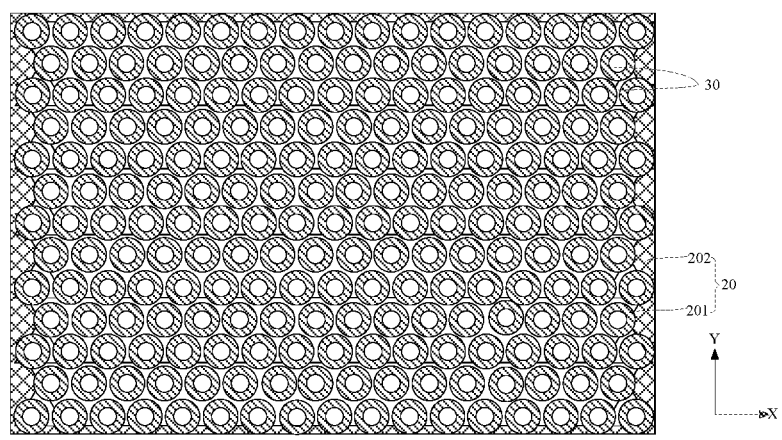
FIG. 5 is a second distribution diagram of a dielectric layer and an air gap according to the first embodiment of this application.

The plurality of circular rings are arranged in an array in the filling layer 202, and the circular rings in the adjacent rows are misaligned with each other. As shown in FIG. 5, the plurality of annular side walls 201 located on the electrode layer 10 may be divided into a plurality of rows of annular side wall group. Each row of annular side wall group includes a plurality of annular side walls 201 evenly interval arranged along the second direction. The annular side walls 201 in one row of annular side wall group of any two rows of adjacent annular side wall group are misaligned with the annular side walls 201 in the other row of annular side wall group of any two rows of adjacent annular side wall group. That is to say, the annular side walls 201 in an odd-numbered row are misaligned with the annular side walls 201 in an even-numbered row, so that the annular side walls 201 in the old-numbered row are aligned in a column direction, and the annular side walls 201 in the even-numbered row are aligned in the column direction, thus the annular side walls 201 in the dielectric layer 20 are more compactly arranged. The density of the annular side walls 201 in the dielectric layer 20 may be increased through arranging more annular side walls 201 in an unit area, thereby forming more air gaps in the dielectric layer, reducing the dielectric constant of the dielectric layer 20, reducing the signal delay of the semiconductor structure and improving the performance of the semiconductor structure.

Figure 6:
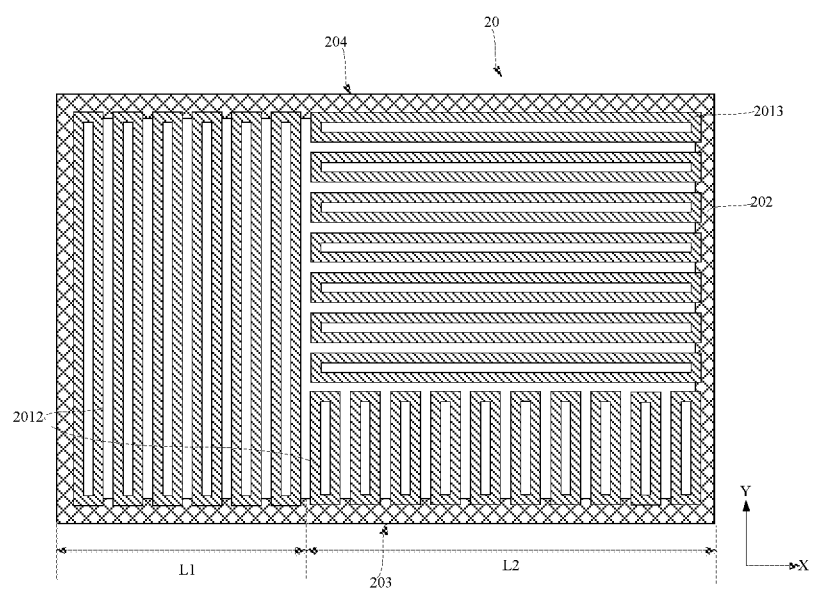
FIG. 6 is a third distribution diagram of a dielectric layer and an air gap according to the first embodiment of this application.

In some embodiments, as shown in FIG. 6, the plurality of annular side walls 201 include a plurality of first elongated rings 2012 extending along the first direction, and the plurality of first elongated rings 2012 are interval arranged along the second direction to form an L-shaped pattern.

The plurality of annular side walls 201 include a plurality of second elongated rings 2013 extending along the second direction, and the plurality of second elongated rings 2013 are interval arranged along the first direction to form a first rectangular pattern. The first rectangular pattern is located in an area enclosed by the L-shaped pattern, and the L-shaped pattern and the first rectangular pattern form a second rectangular pattern.

As shown in FIG. 6, the dielectric layer 20 may include a first area L1 and a second area L2 connected to the first area L1. Taking an orientation shown in FIG. 7 as an example, the first area L1 is located at the left side of the second area L2, and the dielectric layer 20 has a first end 203 and a second end 204 that are arranged opposite to each other along the first direction. That is to say, the first end 203 is a lower end face, and the second end 204 is an upper end face.

The plurality of first elongated rings 2012 are interval arranged along the second direction, so that the first elongated rings 2012 extending along the first direction are respectively located in the first area L1 and the second area L2. Herein, the first elongated rings 2012 located in the first area L1 extend from the first end 203 to the second end 204, and the first elongated rings 2012 located in second area L2 extend from the first end 203 to the interior of the electrode layer 10 and do not extend to the second end 204. That is to say, the first elongated rings 2012 located in the first area L1 are longer than the first elongated rings 2012 located in the second area L2, so that the plurality of first elongated rings 2012 form the L-shaped pattern.

The plurality of second elongated rings 2013 are located in the second area L2, are interval arranged along the first direction and arranged in the area enclosed by the plurality of first elongated rings 2012, and form the first rectangular pattern. The first rectangular pattern and the L-shaped pattern form a second rectangular pattern.

Thus, in this embodiment, the annular side walls 201 in the dielectric layer 20 are more compactly arranged, the density of the annular side walls 201 arranged in the dielectric layer 20 may be increased through arranging more annular side walls 201 in the unit area, thereby forming more air gaps in the dielectric layer, reducing the dielectric constant of the dielectric layer 20, reducing the signal delay of the semiconductor structure and improving the performance of the semiconductor structure.

Figure 7:
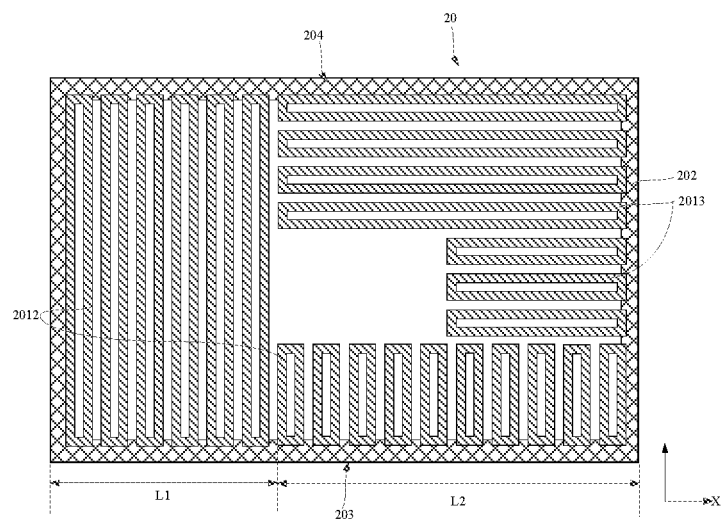
FIG. 7 is a fourth distribution diagram of a dielectric layer and an air gap according to the first embodiment of this application.

In some embodiments, as shown in FIG. 7, the plurality of annular side walls 201 include a plurality of first elongated rings 2012 extending along the first direction, and the plurality of first elongated rings 2012 are interval arranged along the second direction to form a first L-shaped pattern.

The plurality of annular side walls 201 further include a plurality of second elongated rings 2013 extending along the second direction, and the plurality of second elongated rings 2013 are interval arranged along the first direction to form a second L-shaped pattern. The first L-shaped pattern and the second L-shaped pattern form a rectangular pattern. That is to say, a part of the second elongated rings 2013 located in the second area is interval arranged from the first elongated rings 2012 located in the first area. Herein, a central area of the rectangular pattern is a blank area, and the central area of the rectangular pattern is configured to arrange a contact window 60, which can be connected to the two adjacent electrode layers 10 arranged in different layers, thereby achieving the electric connection of the adjacent electrode layers 10 arranged in different layers.

When the two adjacent electrode layers 10 need to be electrically connected with each other, a through hole penetrating through the dielectric layer 20 is usually formed on the dielectric layer 20, and a conductive material is deposited in the through hole so as to form the contact window 60. In this embodiment, in order to ensure the structural strength and conductivity of the contact window 60, a position where the contact window 60 is formed is reserved in the overlapping area of the two electrode layers 10, so that when the filling layer 202 is subsequently deposited, the dielectric layer 20 around the contact window 60 may form a dense structure, thereby ensuring the normal function of the contact window 60.

Figure 8:
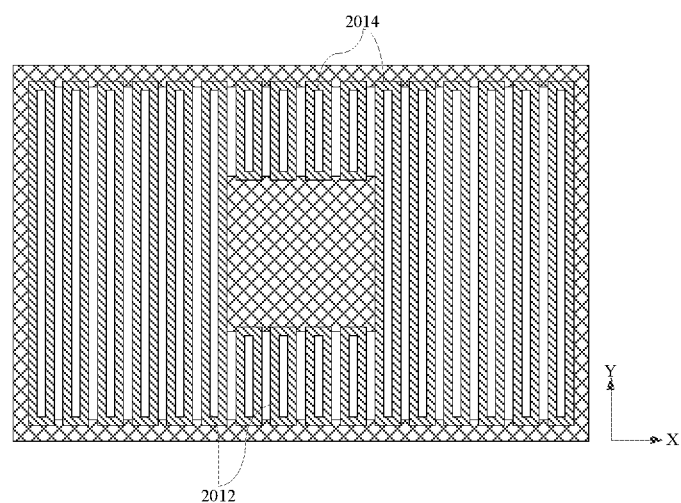
FIG. 8 is a fifth distribution diagram of a dielectric layer and an air gap according to the first embodiment of this application.
Figure 9:
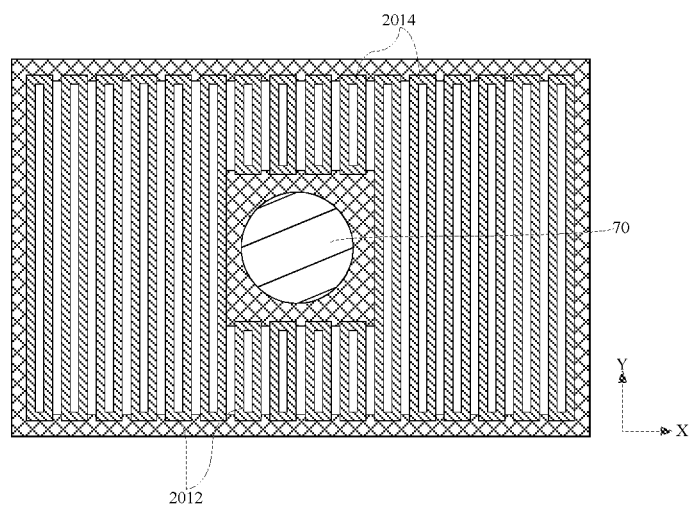
FIG. 9 is a distribution diagram of an electrode layer, an air gap and a welding pad according to the first embodiment of this application.

In some embodiments, as shown in FIG. 8 and FIG. 9, the plurality of annular side walls 201 include a plurality of first elongated rings 2012 and a plurality of third elongated rings 2014, and the plurality of first elongated rings 2012 and the plurality of third elongated rings 2014 extend along the first direction. The plurality of first elongated rings 2012 are interval arranged along the second direction to form a third L-shaped pattern, the plurality of third elongated rings 2014 are interval arranged along the second direction to form a four L-shaped pattern. The third L-shaped pattern and the fourth L-shaped pattern form a rectangular pattern with a hollow area.

In this embodiment, the hollow area of the rectangular pattern is configured to arrange the contact window 60 or the welding pad 70. In the semiconductor structure 100, the welding pad 70 needs to be arranged on the electrode layer 10, and the electric connection between a flexible printed circuit board and the semiconductor structure 100 is achieved by welding the flexible printed circuit board on the welding pad 70. In this embodiment, a position where the welding pad 70 is formed is reserved in the overlapping area of the two electrode layers 10, so that when the filling layer is subsequently deposited, the dielectric layer 20 around the welding pad 70 may form a dense structure, thereby avoiding damage on the electrode layers 10 during a welding process.

In some embodiment, along the second direction, the width of each annular side wall 201 is gradually reduced or increased from one of the two adjacent electrode layers to the other one of the two adjacent electrode layers. For example, taking orientations shown in FIG. 2 and FIG. 3 as an example, a gap enclosed by the annular side walls 201 is gradually increased from bottom to top, thus facilitating the formation of the air gap 30, and achieving the purpose of reducing the dielectric constant of the dielectric layer 20.

In some embodiments, a barrier layer 40 is arranged between the electrode layer 10 and the dielectric layer 20, and the barrier layer 40 is configured to prevent ions of the electrode layer 10 from diffusing into the dielectric layer 20.

In this embodiment, the electrode layer 10 is usually copper or another metal. In this embodiment, the barrier layer 40 is arranged between the electrode layer 10 and the dielectric layer 20, and the barrier layer 40 may be one or two of silicon nitride and silicon carbon nitride. The ions of the electrode layer 10 may be prevented from diffusing into the dielectric layer 20 through arranging the barrier layer 40, or the ions in the dielectric layer 20 may be prevented from diffusing into the electrode layer 10, so as to ensure the performance of the electrode layer 10 or the dielectric layer 20.

In some embodiments, still referring to FIG. 2, each electrode layer 10 includes a first electrode block 101 and a second electrode block 102 that are arranged in the same layer and interval arranged. The first electrode block 101 and the second electrode block 102 that are located in the same electrode layer 10 are mutually insulated from each other to prevent the electric connection of the first electrode block 101 and the second electrode block 102 that are located in the same electrode layer 10.

Herein, the projected area of the first electrode block 101 on the barrier layer 40 may be the same as or different from the projected area of the second electrode block 102 on the barrier layer 40. For example, the projected area of the first electrode block 101 on the barrier layer 40 is greater than the projected area of the second electrode block 102 on the barrier layer 40.

In this embodiment, the electrode layer 10 is set as a plurality of electrode blocks interval arranged, so that the function of each electrode block may be designed according to an actual application scene of the semiconductor structure 100, and then the scope of application of the electrode layer 10 is increased.

The number of the electrode blocks in each electrode layer 10 may be the same or different. For example, as shown in FIG. 3, the semiconductor structure 100 disclosed by this embodiment includes three electrode layers 10. Taking an orientation shown in FIG. 3 as an example, the three electrode layers 10 may be respectively marked as a first electrode layer, a second electrode layer and a third electrode layer from bottom to top. Herein, the numbers of the first electrode block 101 and the second electrode block 102 in the first electrode layer are the same as the numbers of the first electrode block 101 and the second electrode block 102 in the second electrode layer. The third electrode layer includes one first electrode block 101 and two second electrode blocks 102. One of the second electrode blocks 102 in the third electrode layer is electrically connected to the first electrode block 101 in the second electrode layer through the contact window 60, and the other one of the second electrode blocks 102 in the third electrode layer is electrically connected to the second electrode block 102 in the second electrode layer.

Further, in the two adjacent electrode layers 10: the two first electrode layers 101 that are adjacent to each other and arranged in different layers overlap with each other and have an overlapping area. Furthermore, the first electrode block 101 and the second electrode block 102 that are adjacent to each other and arranged in different layers overlap with each other and have an overlapping area, That is to say, in the two adjacent electrode layers, a part of the projection of the first electrode block 101 of one electrode layer 10 on the other electrode layer 10 is located on the first electrode block 101 of the other electrode layer 10, and the other part of said projection is located on the second electrode block 102 of the other electrode layer 10.

In addition, the first electrode block 101 and the second electrode block 102 that are adjacent to each other and arranged in different layers are electrically connected with each other through a contact window 60, so as to achieve the electric connection between the first electrode block 101 and the second electrode block 102 that are arranged in different layers, thereby facilitating the signal delivery.

The first electrode block 101 and the second electrode block 102 that are adjacent to each other and arranged in different layers are electrically connected with each other through the contact window 60, that is to say, the first electrode block 101 and the second electrode block 102 that are adjacent to each other and arranged in different layers have the consistent voltage, and thus the stray capacitance is not formed between the first electrode block 101 and the second electrode block 102. Therefore, in order to ensure the electric contact between the first electrode block 101 and the second electrode block 102, the air gap 30 may not be arranged in the dielectric layer close to the contact window 60.

Or, the air gap 30 may be only arranged in the overlapping area of the two adjacent first electrode blocks 101 arranged in different layers, thereby achieving the effect of reducing the dielectric constant and ensuring the structural strength of the dielectric layer.

Further, the dielectric layer 20 is arranged between the two adjacent first electrode blocks 101 arranged in different layers, the through hole penetrating through the dielectric layer 20 is formed on the dielectric layer 20, and the conductive material is filled in the through hole to form the contact window 60. Through using the conductivity of the conductive material, the electric connection between the first electrode block 101 and the second electrode block 102 that are adjacent to each other and arranged in different layers is achieved. Herein, the conductive material may be a metal material, such as copper.

It is worth noting that that the conductive material may be the same or different from the material of the electrode layer 10. When the conductive material is the same as the material of the electrode layer 10, the conductive material may be deposited on the dielectric layer after through hole is formed on the dielectric layer 20. The contact window 60 and the electrode layer 10 may be simultaneously prepared by using a deposition process, thereby simplifying the preparation process for the semiconductor structure 100.

Second Embodiment

Figure 10:
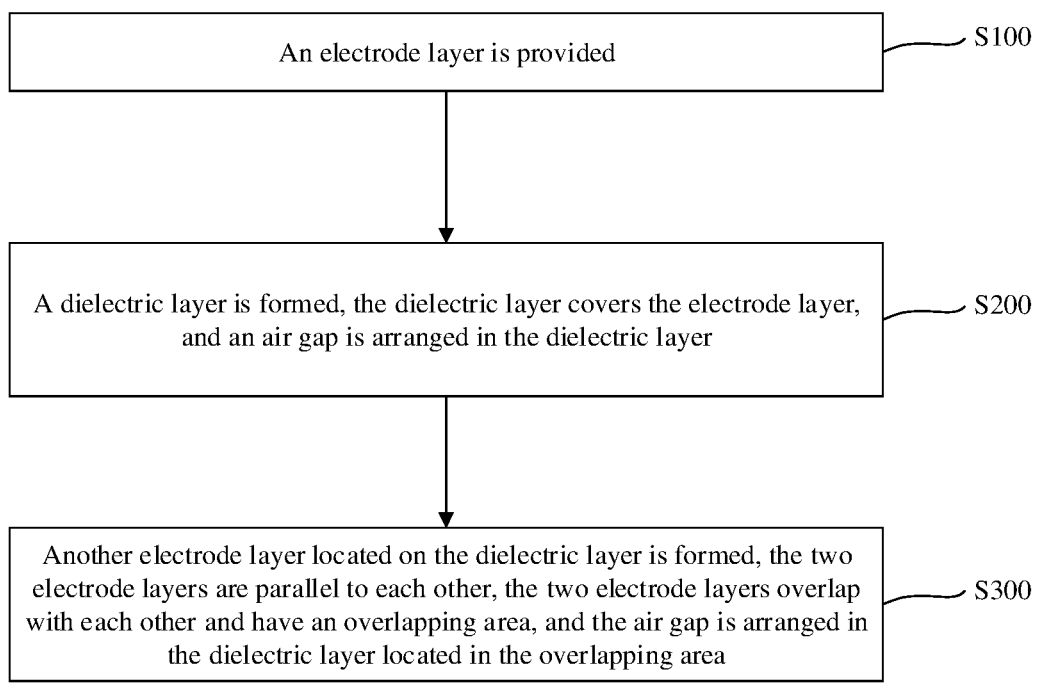
FIG. 10 is a first flowchart of a method for manufacturing a semiconductor structure according to a second embodiment of this application.

As shown in FIG. 10, embodiments of this application provide a method for manufacturing a semiconductor structure, including the following operations.

At S100, an electrode layer is provided.

Herein, when the semiconductor structure 100 is applied to a thin film transistor, the electrode layer 10 may be a M1 metal layer or a M2 metal layer in the thin film transistor. When the semiconductor structure 100 is applied to a memory, the electrode layer may be a polar plate of a capacitor, or a metal wire arranged on a base of the memory.

At S200, a dielectric layer 20 is formed. The dielectric layer 20 covers the electrode layer 10, and an air gap 30 is arranged in the dielectric layer 20.

Herein, the dielectric layer 20 may be an insulation layer formed by silicon nitride, silicon oxide, silicon oxynitride or other insulation materials, thereby achieving the mutual insulation of two electrode layers 10 that are arranged in different layers. In this embodiment, the dielectric layer 20 may be directly or indirectly formed on the electrode layer 10.

The air gap 30 may be an air gap. Since the dielectric constant of the air is less than the dielectric constant of another material, the dielectric constant of the air gap 30 is less than the dielectric constant of the dielectric layer 20, thereby reducing the dielectric constant of the dielectric layer 20, reducing the capacitance value of the stray capacitance, reducing the signal delay of the semiconductor structure 100 and improving the performance of the semiconductor structure 100.

Exemplarily, before the operation that the dielectric layer 20 is formed, the method further includes the following S110.

A barrier layer 40 is formed on the electrode layer 10, and the dielectric layer 20 is formed on the barrier layer 40.

Herein, the material of the barrier layer 40 may be one or more of silicon oxide, silicon carbon nitride or other materials. The substances in the electrode layer 10 may be prevented from diffusing into the dielectric layer 20, or the substances in the dielectric layer 20 may be prevented from diffusing into the electrode layer 10 through the arrangement of the barrier layer 40, thereby ensuring the performance of the electrode layer 10 or the dielectric layer 20.

The binding force between the barrier layer 40 and the electrode layer 10 as well as the binding force between the barrier layer 40 and the dielectric layer 20 is higher than the binding force between the electrode layer 10 and the dielectric layer 20. The binding force between the electrode layer 10 and the dielectric layer 20 may be improved through the arrangement of the barrier layer 40, thereby preventing the electrode layer 10 from being separated from the dielectric layer 20, and improving the performance of the semiconductor structure 100.

In this operation, the formed dielectric layer 20 is provided with the air gap 30. Herein, there may be one air gap 30 or a plurality of air gaps 30. The plurality of air gaps 30 may be arranged on the dielectric layer 20 and interval arranged, so that the dielectric layer 20 can form a non-dense film. In this manner, the dielectric constant of the air gap 30 is less than the dielectric constant of the dielectric layer 20, so that the dielectric constant of the dielectric layer 20 is reduced.

Figure 11:
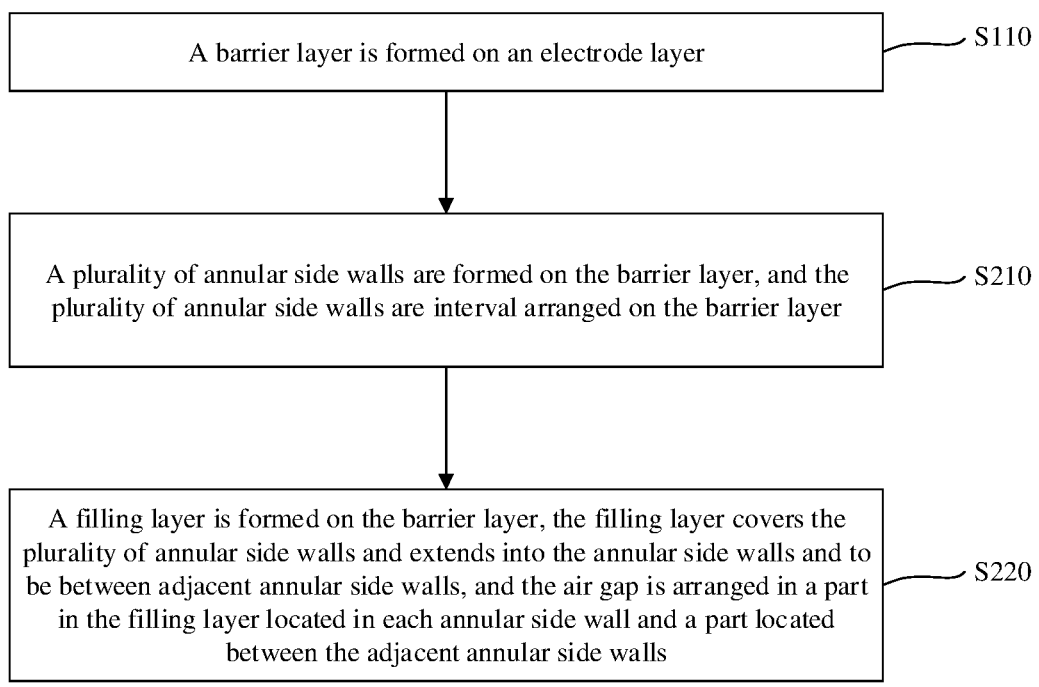
FIG. 11 is a second flowchart of a method for manufacturing a semiconductor structure according to the second embodiment of this application.

As shown in FIG. 11, the operation that the dielectric layer 20 is formed specifically includes the following operations.

At S210, a plurality of annular side walls 201 are formed on the barrier layer 40, and the plurality of annular side walls 201 are arranged on the barrier layer 40 and interval arranged.

Exemplarily, a gasket layer 2011 of the insulation material may be deposited on the barrier layer 40 through chemical deposition, physical deposition or evaporation, and then the plurality of annular side walls 201 interval arranged are formed on the gasket layer 2011 through an etching manner.

Herein, a plane parallel to the barrier layer 40 is taken as a section, and the section shape of each annular side wall 201 may be an elongated ring or a circular ring. In addition, the material of the gasket layer 2011 may be one or more of silicon oxide, silicon nitride, silicon oxynitride, silicon carbon oxide or silicon carbon nitride.

Figure 12:
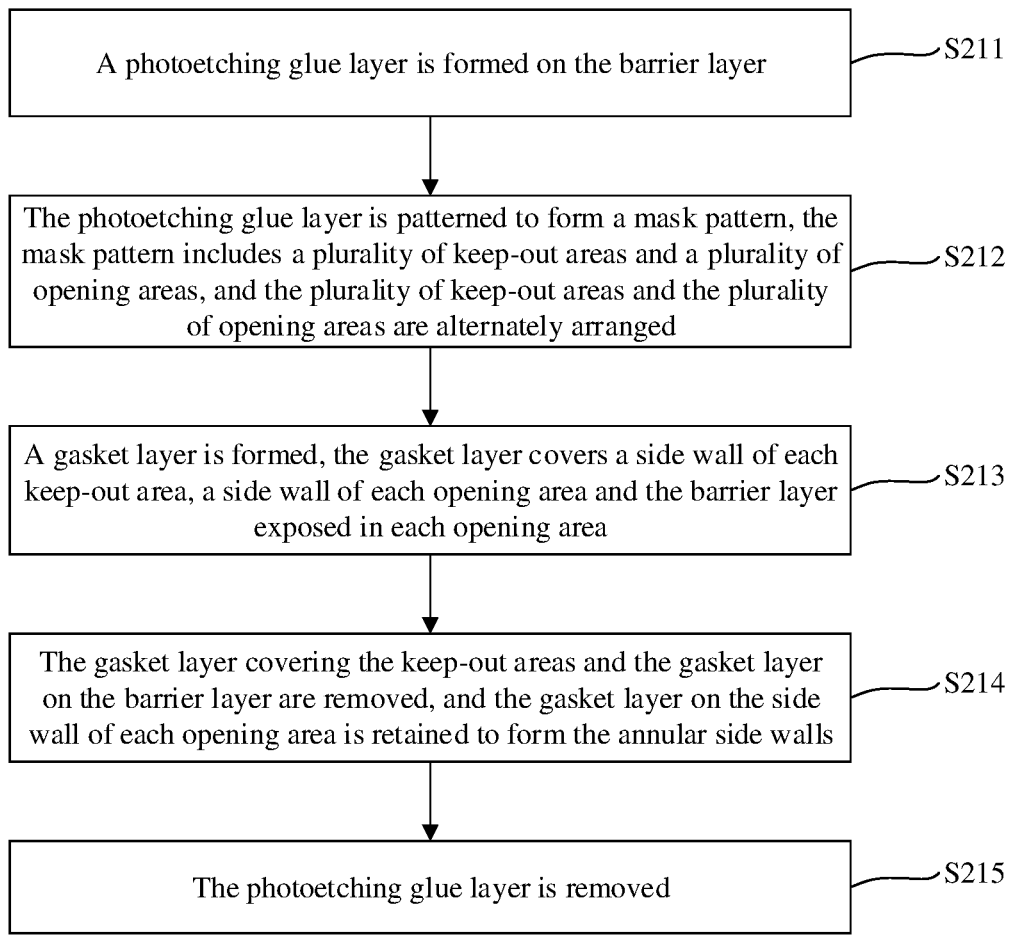
FIG. 12 is a third flowchart of a method for manufacturing a semiconductor structure according to the second embodiment of this application.

In addition, the operation that the plurality of annular side walls 201 are formed on the barrier layer 40, and the plurality of annular side walls 201 are arranged on the barrier layer 40 and interval arranged may be performed through the following manner, as shown in FIG. 12.

At S211, a photoetching glue layer 50 is formed on the barrier layer 40.

The photoetching glue layer 50 may be formed on the barrier layer 40 by a coating-curing manner, a deposition manner or other manners, and the photoetching glue layer 50 is covered on an upper surface of the barrier layer 40.

Figure 13:
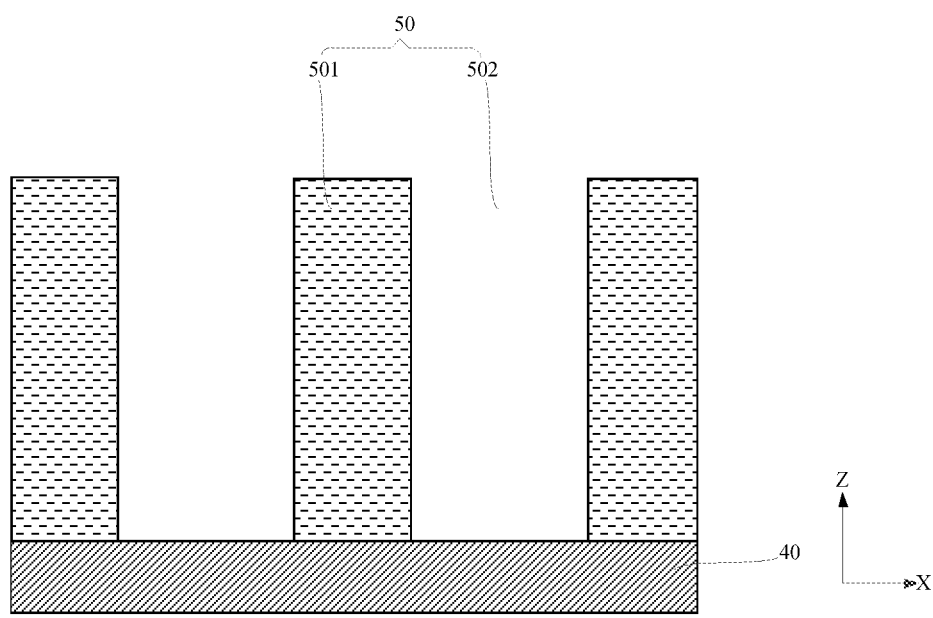
FIG. 13 is a schematic diagram for forming a mask pattern in a method for manufacturing a semiconductor structure according to the second embodiment of this application.
Figure 14:
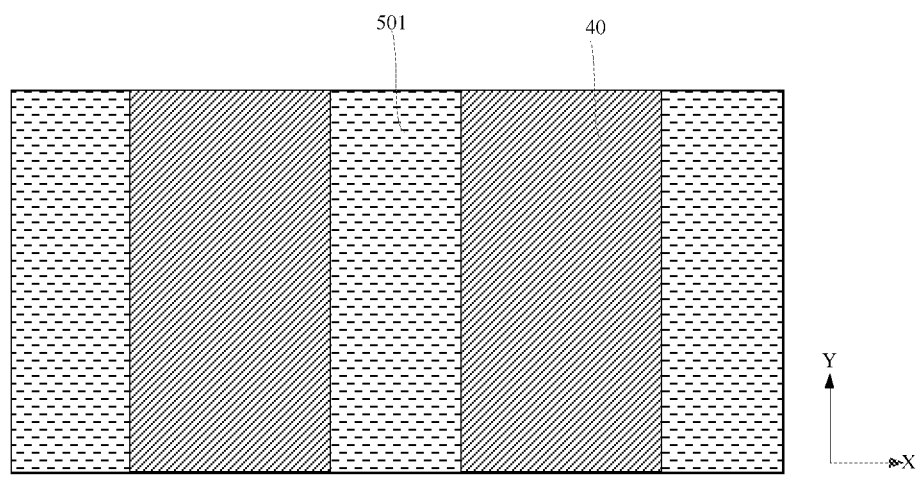
FIG. 14 is a top view for forming a mask pattern in a method for manufacturing a semiconductor structure according to the second embodiment of this application.

At S212, the photoetching glue layer 50 is patterned to form a mask pattern, namely, the pattern as shown in FIG. 13 and FIG. 14. The mask pattern includes a plurality of keep-out areas 501 and a plurality of opening areas 502, and the plurality of keep-out areas 501 and the plurality of opening areas 502 are alternately arranged.

The photoetching glue layer 50 is patterned through the patterning processing manners, such as mask, exposure, developing and etching, so as to form the mask pattern. That is to say, a plurality of grooves interval arranged are formed on the photoetching glue layer 50.

At S213, a gasket layer 2011 is formed. The gasket layer 2011 covers a side wall of each keep-out area 501, a side wall of each opening area 502 and the barrier layer 40 exposed in each opening area.

Figure 15:
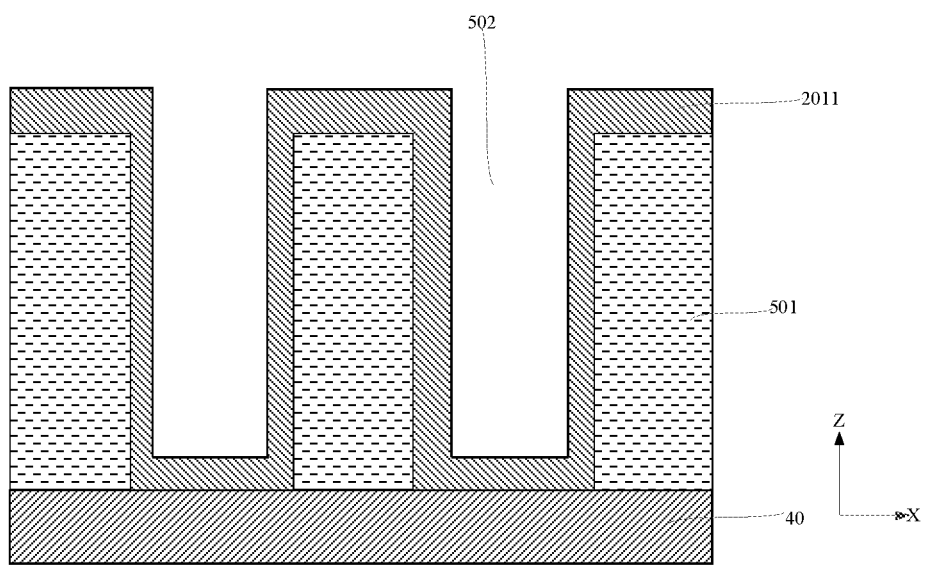
FIG. 15 is a schematic diagram for forming a gasket layer in a method for manufacturing a semiconductor structure according to the second embodiment of this application.
Figure 16:
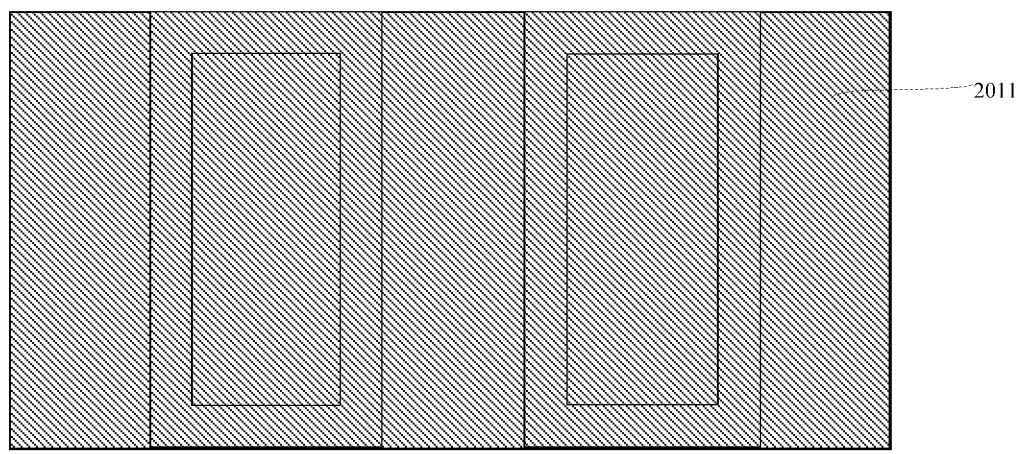
FIG. 16 is a top view for forming a gasket layer in a method for manufacturing a semiconductor structure according to the second embodiment of this application.

In this operation, the gasket layer 2011 may be deposited on the photoetching glue layer 50 through a chemical vapor deposition process or other processes. The gasket layer 2011 covers the side wall of each keep-out area 501, the side wall of each opening area 502, and the barrier layer 40 exposed in each opening area, so as to form the structure as shown in FIG. 15 and FIG. 16.

At S214, the gasket layer 2011 on the top surfaces of the keep-out areas 501 and on the barrier layer 40 is removed, where the gasket layer 2011 on the side wall of each opening area 502 is retained to form the annular side walls 201.

Figure 17:
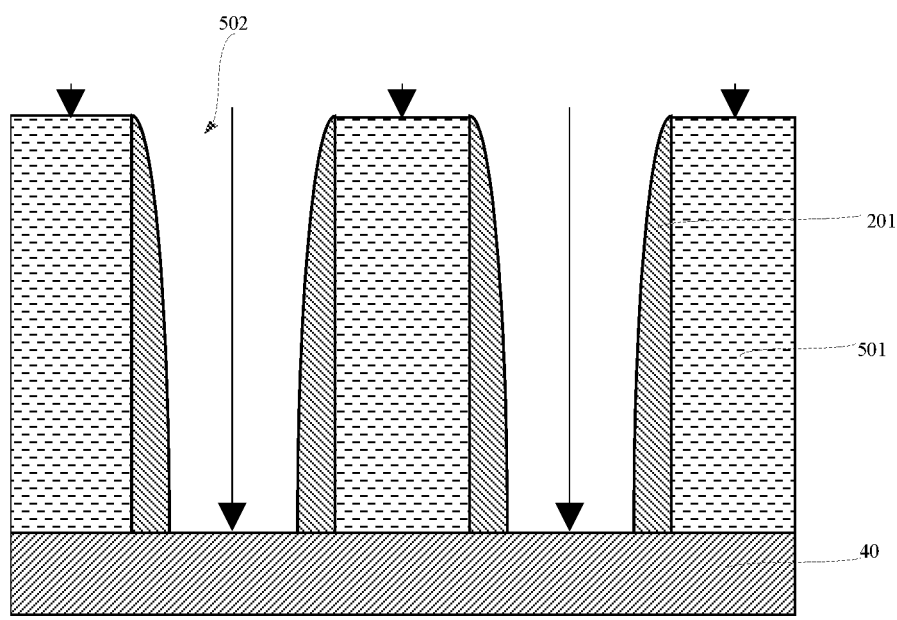
FIG. 17 is a schematic diagram for forming an annular side wall in a method for manufacturing a semiconductor structure according to the second embodiment of this application.
Figure 18:
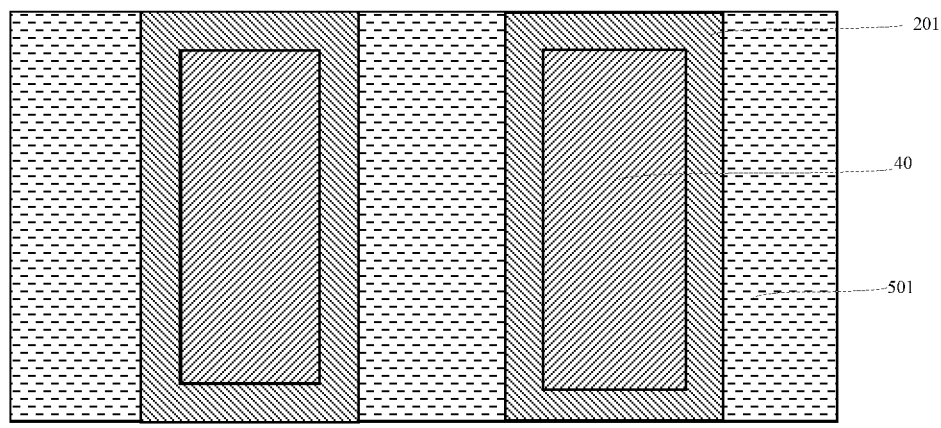
FIG. 18 is a top view for forming an annular side wall in a method for manufacturing a semiconductor structure according to the second embodiment of this application.

In S214, the gasket layer 2011 to be removed may be eliminated by the etching process, so as to retain the gasket layer 2011 on the side wall of each opening area 502 to form the annular side walls 201 as shown in FIG. 17 and FIG. 18.

At S215, the photoetching glue layer 50 is removed.

Figure 19:
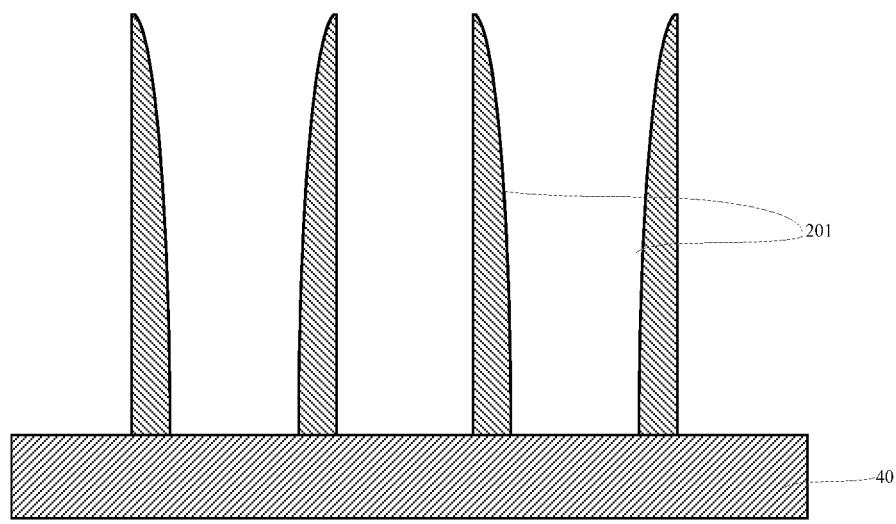
FIG. 19 is a schematic diagram for removing a photoetching glue layer in a method for manufacturing a semiconductor structure according to the second embodiment of this application.
Figure 20:
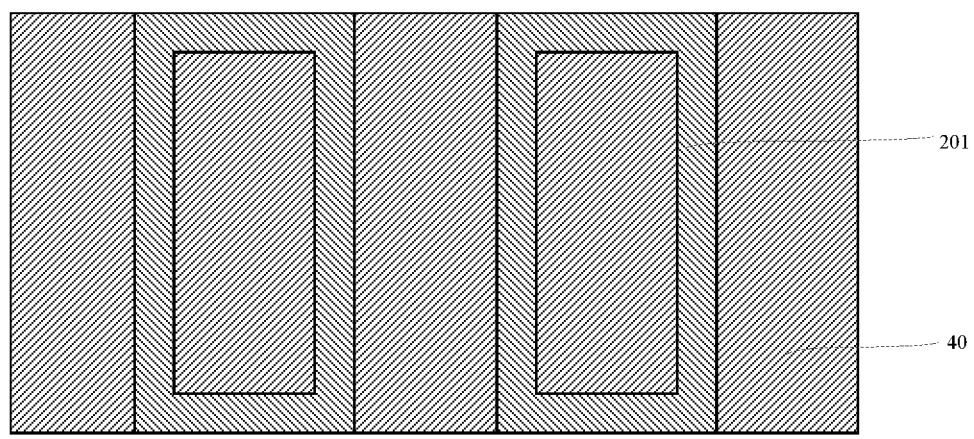
FIG. 20 is a top view for removing a photoetching glue layer in a method for manufacturing a semiconductor structure according to the second embodiment of this application.

The photoetching glue layer 50 located between various annular side walls 201 is removed by the etching process, so as to form the structure as shown in FIG. 19 and FIG. 20.

In some embodiments, after the operation that the barrier layer 40 is formed on the electrode layer 10, the method further includes the following operations.

The buffer layer is formed on the barrier layer 40. That is to say, the buffer layer is arranged between the barrier layer 40 and the annular side wall 201. In this way, the buffer layer may be firstly formed on the barrier layer 40, and then the plurality of annular side walls 201 are formed on the buffer layer.

In this embodiment, the material of the buffer layer may be with the same as the material of the dielectric layer 20, such as one or more of silicon nitride, silicon oxide or silicon oxynitride. The annular side walls 201 and the barrier layer 40 are interval arranged by forming the annular side walls 201 on the buffer layer, thereby avoiding damage on the barrier layer 40 and improving the performance of the semiconductor structure during the subsequent preparation of the annular side walls 201.

At S220, a filling layer 202 is formed on the barrier layer 40. The filling layer 202 covers the plurality of annular side walls 201 and extends into the annular side walls 201 and to be between the adjacent annular side walls 201. The air gap 30 is arranged in a part in the filling layer 202 located in each annular side wall 201 and a part located between the adjacent annular side walls 201. The air gap 30 may be an air gap.

Figure 21:
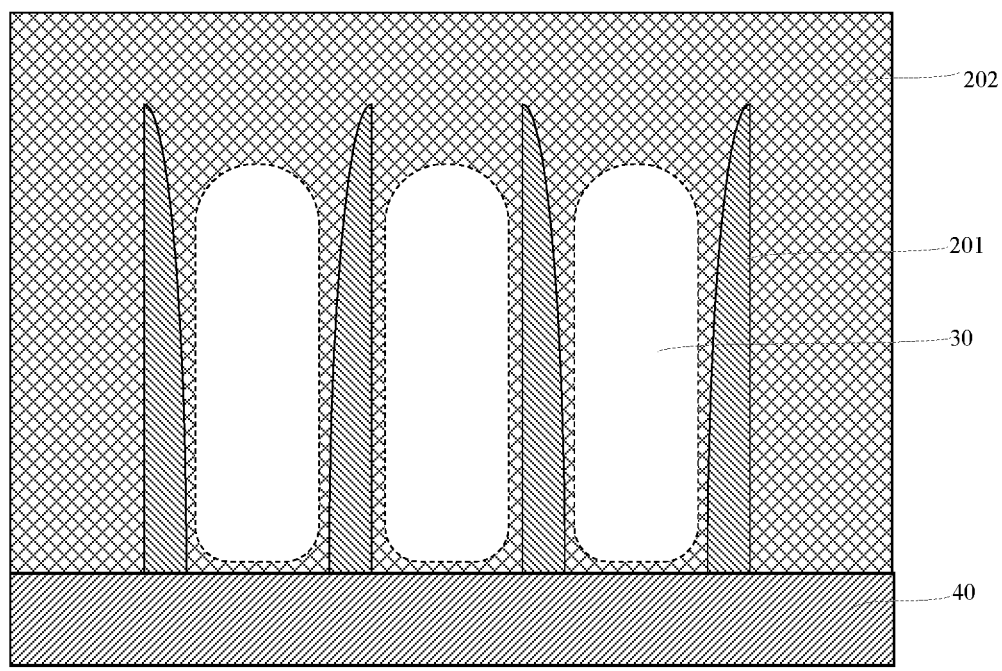
FIG. 21 is a schematic diagram for forming a dielectric layer in a method for manufacturing a semiconductor structure according to the second embodiment of this application.
Figure 22:
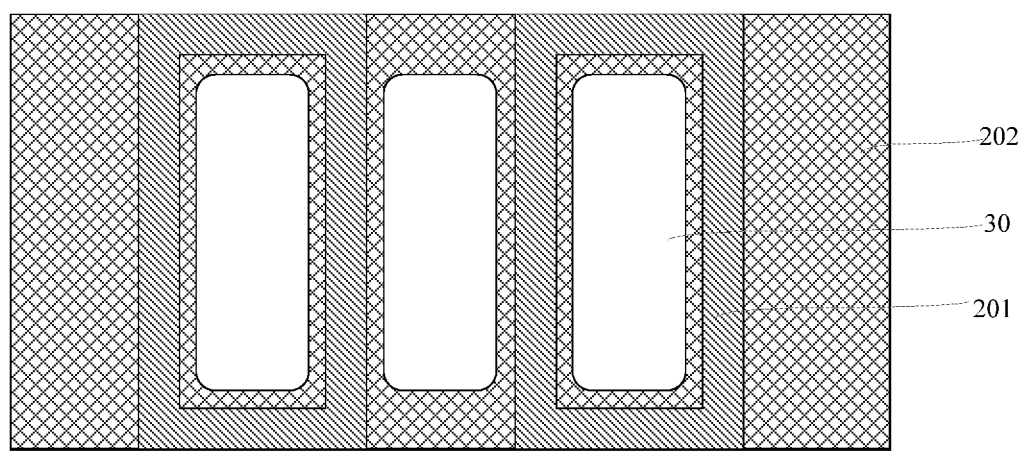
FIG. 22 is a look-down diagram for forming a dielectric layer in a method for manufacturing a semiconductor structure according to the second embodiment of this application.

In this operation, the filling layer 202 may be formed on the barrier layer 40 through a chemical vapor deposition manufacturing process, and the filling layer 202 covers the side wall of the annular side wall 201 and extends into the annular side walls 201 and to be between adjacent annular side walls 201. Under the control of a deposition process, the filling layer in the annular side walls 201 and between the adjacent annular side walls 201 may naturally form the air gaps 30, so as to form the structure as shown in FIG. 21 and FIG. 22.

The air gaps 30 in this embodiment may reduce the dielectric constant of the dielectric layer 20, thereby reducing the capacitance value of the stray capacitance, reducing the signal delay of the semiconductor structure 100 and improving the performance of the semiconductor structure 100.

At S300, another electrode layer 10 located on the dielectric layer 20 is formed. The two electrode layers 10 are parallel to each other, and the two adjacent electrode layers 10 overlap with each other and have an overlapping area. The air gap 30 is arranged in the dielectric layer 20 located in the overlapping area.

When different voltages are applied to the two electrode layers 10, the stray capacitance will be formed between the two electrode layers 10. Therefore, in this embodiment, the air gap 30 is arranged at the part in the dielectric layer 20 corresponding to the overlapping area. Since the dielectric constant of the air gap 30 is less than the dielectric constant of the dielectric layer 20, the capacitance value of the stray capacitance between the two electrode layers 10 having the overlapping area is reduced, thereby reducing the signal delay of the semiconductor structure 100 and improving the performance of the semiconductor structure 100.

It should be understood that the air gap 30 in this embodiment may be arranged in the area in the dielectric layer 20 corresponding to the overlapping area, or arranged in the entire dielectric layer 20.

Figure 23:
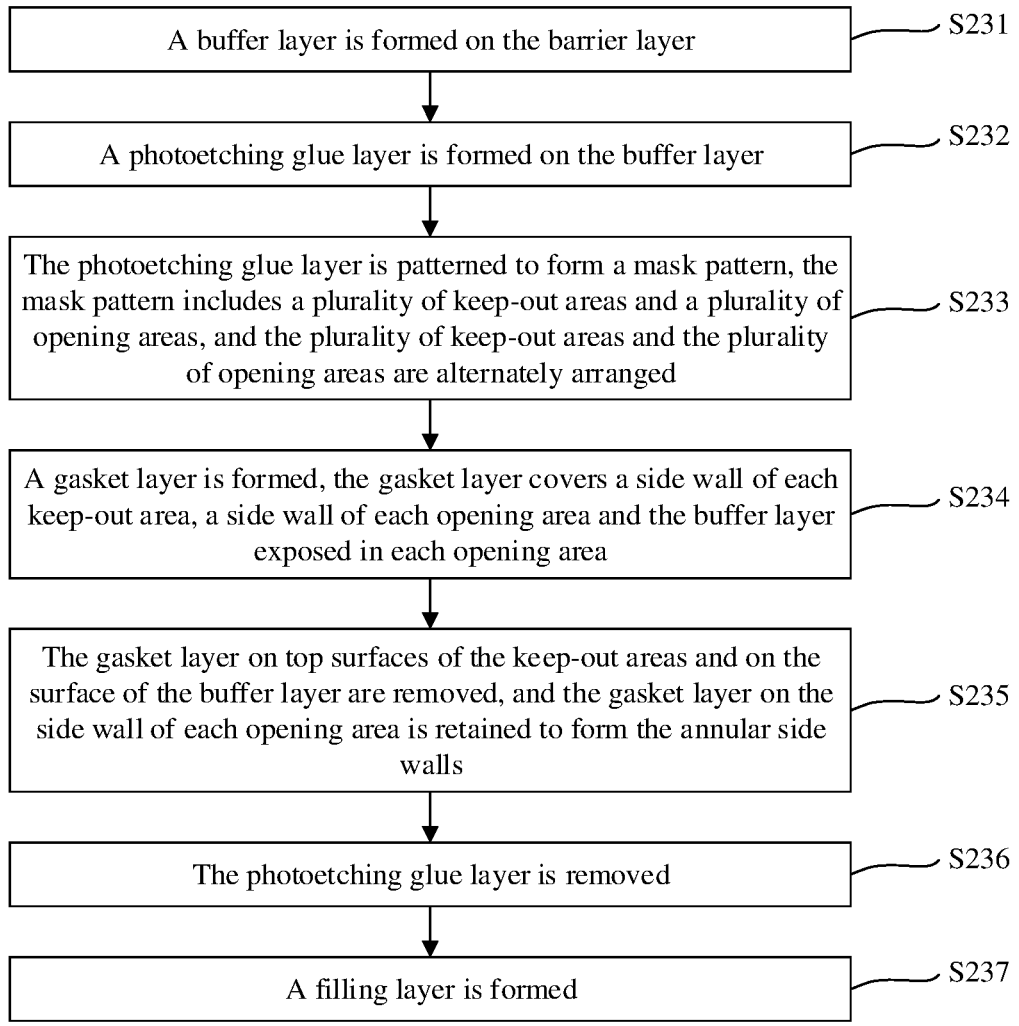
FIG. 23 is a fourth flowchart of a method for manufacturing a semiconductor structure according to the second embodiment of this application.

Further, in the embodiments of this application, the operation that the dielectric layer 20 located on the electrode layer 10 is formed, the dielectric layer 20 is provided with the air gap 30, and the dielectric constant of the air gap 30 is less than the dielectric constant of the dielectric layer 20 may also be performed by the following manner, as shown in FIG. 23.

At S231, a buffer layer is formed on the barrier layer.

The material of the buffer layer may be the same as the material of the dielectric layer, so that an air gap structure may be formed in the middle of the dielectric layer.

At S232, a photoetching glue layer is formed on a buffer layer.

The photoetching glue layer may be formed by a coating-curing manner, a deposition manner or other manners.

At S232, the photoetching glue layer is patterned to form a mask pattern, which includes a plurality of keep-out areas and a plurality of opening areas that are alternately arranged.

The photoetching glue layer is patterned through the patterning processing manners, such as mask, exposure, developing and etching, so as to form the mask pattern. That is to say, a plurality of grooves interval arranged are formed on the photoetching glue layer.

At S233, a gasket layer is formed, the gasket layer covers the side wall of each keep-out area, the side wall of each opening area and the buffer layer exposed in each opening area.

At S234, the gasket layer on the top surfaces of the keep-out areas and on the buffer layer is removed, and the gasket layer on the side wall of each opening area is retained to form the annular side walls.

At S235, the photoetching glue layer is removed.

At S236, a filling layer is formed.

The filling layer in the opening areas may naturally form the air gap under the control of a deposition process, which may reduce the dielectric constant of the dielectric layer, thereby reducing the capacitance value of the stray capacitance, reducing the signal delay of the semiconductor structure and improving the performance of the semiconductor structure.

Figure 24:
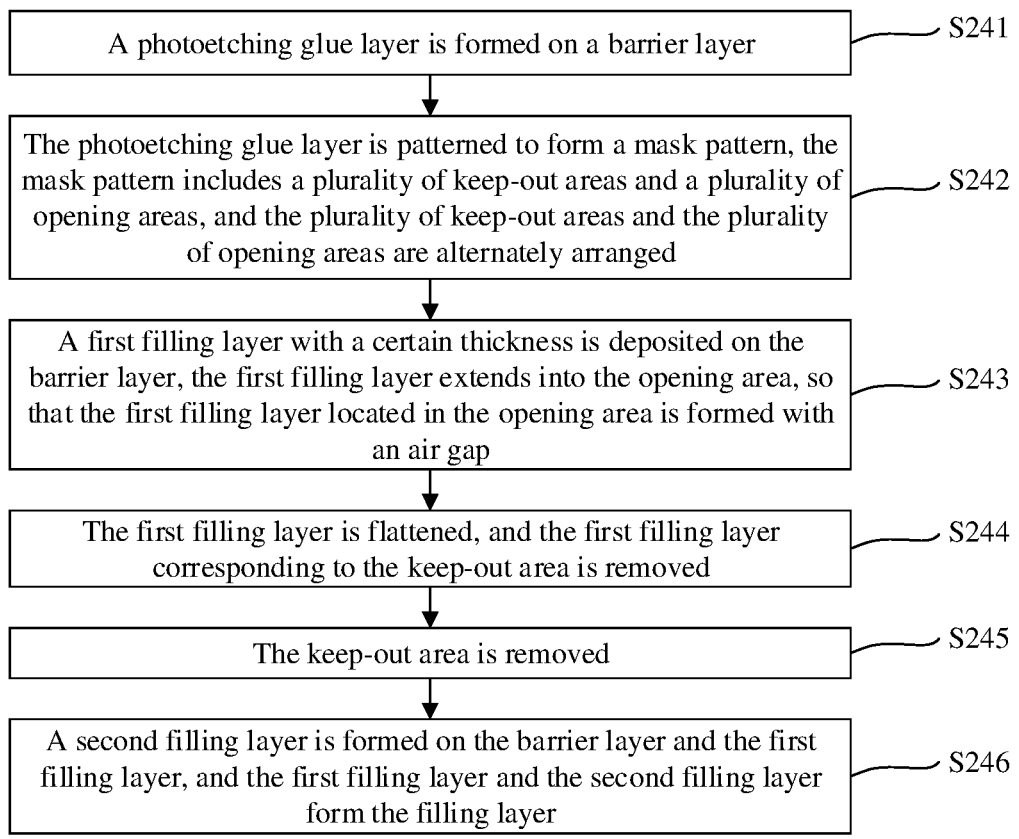
FIG. 24 is a fifth flowchart of a method for manufacturing a semiconductor structure according to the second embodiment of this application.

In the embodiments of this application, the operation that the dielectric layer 20 located on the electrode layer 10 is formed, the dielectric layer 20 is provided with the air gap 30, and the dielectric constant of the air gap 30 being less than the dielectric constant of the dielectric layer 20 may also be performed by the following manner, as shown in FIG. 24.

At S241, a photoetching glue layer is formed on a barrier layer.

The photoetching glue layer may be formed on the barrier layer by a coating-curing manner, an ink-jet printing manner and a deposition manner, and the photoetching glue layer is covered on the upper surface of the barrier layer.

At S242, the photoetching glue layer is patterned to form a mask pattern, which includes a plurality of keep-out areas and a plurality of opening areas that are alternately arranged.

The photoetching glue layer is patterned through the patterning processing manners, such as mask, exposure, developing and etching, so as to form the mask pattern. That is to say, a plurality of grooves interval arranged are formed on the photoetching glue layer.

At S243, a first filling layer with a certain thickness is deposited on the barrier layer, and the first filling layer extends to the opening area, so that the first filling layer located in the opening area is formed with an air gap.

In this operation, the first filling layer may be formed on the barrier layer through a chemical vapor deposition manufacturing process, and the first filling layer is covered on the keep-out area and extends into the opening area. The first filling layer in the opening area may naturally form the air gaps under the control of a deposition process, which may reduce the dielectric constant of the dielectric layer, thereby reducing the capacitance value of the stray capacitance, reducing the signal delay of the semiconductor structure and improving the performance of the semiconductor structure.

At S244, the first filling layer is flattened, and the first filling layer corresponding to the keep-out area is removed.

The first filling layer corresponding to the keep-out area is removed by the etching process, so as to retain the keep-out area and the first filling layer in the opening area.

At S245, the keep-out area is removed.

The keep-out area is removed by the etching process, so as to retain the first filling layer in the opening area.

At S246, a second filling layer is formed on the barrier layer and the first filling layer, and the first filling layer and the second filling layer form the filling layer in this application.

In this embodiment, during the formation of the air gap in the dielectric layer, it does not need to form the annular side walls firstly, and to form the air gaps in the annular side walls and between the adjacent annular side walls, thus the manufacturing process of the dielectric layer may be simplified, and the manufacturing cost is reduced.

Various embodiments or implementation modes in the specification are described in a progressive manner, each embodiment focuses on the difference from other embodiments, and the same and similar parts of various embodiments can be referred to each other.

In the description of the specification, the descriptions of reference terms "one implementation mode", "some implementation modes", "schematic implementation mode", "example", "specific example", or "some examples" intend to be included in at least one implementation mode or example of this application in combination with the specific characteristics, structures, materials or characteristics of this embodiment or example.

In this specification, the schematic expression of the above terms does not need for the same implementation mode or example. Moreover, the described specific characteristics, structures, materials or characteristics may be combined in one or more implementation modes or examples in a suitable manner.

Finally, it should be noted that the above embodiments are merely used for illustrating the technical solution of this application instead of limiting it. Although this application is described in details with reference to the abovementioned embodiments. Those of ordinary skill in the art should understand that they can still make modifications to the technical solution recorded in the abovementioned embodiments, or make equivalent replacements to part or all of technical characteristics. However, these modifications or replacement do not separate the nature of the corresponding technical solution from the scope of the technical solution of various embodiments of this application.

The invention claimed is:

1. A semiconductor structure, comprising at least two electrode layers, the at least two electrode layers being parallel to each other and arranged in different layers,
   adjacent electrode layers of the at least two electrode layers overlap with each other and have an overlapping area, a dielectric layer is arranged between the adjacent electrode layers, and an air gap is arranged in the dielectric layer located in the overlapping area, wherein the dielectric layer comprises at least two annular side walls and a filling layer covering the at least two annular side walls, and the air gap is arranged in a part in the filling layer located in each of the at least two annular side walls and a part located between adjacent annular side walls of the at least two annular side walls.

2. The semiconductor structure of claim 1, wherein each of the at least two annular side walls is an elongated ring, each elongated ring extends along a first direction, and a plurality of elongated rings are interval arranged along a second direction to form a rectangular pattern.

3. The semiconductor structure of claim 1, wherein each of the at least two annular side walls is a circular ring, a center line of each of a plurality of circular rings is perpendicular to the at least two electrode layers, and the plurality of circular rings are arranged in an array.

4. The semiconductor structure of claim 3, wherein the at least two annular side walls are a plurality of annular side walls that comprise a plurality of rows of annular side wall group, and annular side walls in one row of annular side wall group of two adjacent rows of annular side wall group of the plurality of rows of annular side wall group are misaligned with annular side walls in a second row of annular side wall group of the two adjacent rows of annular side wall group.

5. The semiconductor structure of claim 1, wherein the at least two annular side walls are a plurality of annular side walls that comprise a plurality of first elongated rings extending along a first direction and a plurality of second elongated rings extending along a second direction, and the plurality of first elongated rings are interval arranged along the second direction to form an L-shaped pattern, the plurality of second elongated rings are interval arranged along the first direction to form a first rectangular pattern, the first rectangular pattern is located in an area enclosed by the L-shaped pattern, and the L-shaped pattern and the first rectangular pattern form a second rectangular pattern.

6. The semiconductor structure of claim 1, wherein the at least two annular side walls are a plurality of annular side walls that comprise a plurality of first elongated rings extending along a first direction, the plurality of first elongated rings are interval arranged along a second direction to form a first L-shaped pattern, and the plurality of annular side walls further comprise a plurality of second elongated rings extending along the second direction, the plurality of second elongated rings are interval arranged along the first direction to form a second L-shaped pattern, the first L-shaped pattern and the second L-shaped pattern form a rectangular pattern, and a central area of the rectangular pattern is a blank area configured to set a contact window.

7. The semiconductor structure of claim 1, wherein the at least two annular side walls are a plurality of annular side walls that comprise a plurality of first elongated rings and a plurality of third elongated rings, the plurality of first elongated rings and the plurality of third elongated rings extend along a first direction, the plurality of first elongated rings are interval arranged along a second direction to form a third L-shaped pattern, the plurality of third elongated rings are interval arranged along the second direction to form a fourth L-shaped pattern, the third L-shaped pattern and the fourth L-shaped pattern form a rectangular pattern with a hollow area, and the hollow area is configured to set a contact window.

8. The semiconductor structure of claim 1, wherein a width of each of the at least two annular side walls along a second direction is gradually reduced from one of two adjacent electrode layers of the at least two electrode layers to a second one of the two adjacent electrode layers.

9. The semiconductor structure of claim 1, wherein a width of each of the least two annular side walls along a second direction is gradually increased from one of two adjacent electrode layers of the at least two electrode layers to a second one of the two adjacent electrode layers.

10. The semiconductor structure of claim 1, wherein a barrier layer is arranged between each of the at least two electrode layers and the dielectric layer.

11. The semiconductor structure of claim 1, wherein each of the at least two electrode layers comprises a first electrode block and a second electrode block that are arranged in a same layer and interval arranged, and the first electrode block and the second electrode block that are located in a same electrode layer are mutually insulated from each other, and in two adjacent electrode layers of the at least two electrode layers, the two first electrode blocks that are adjacent to each other and arranged in different layers overlap with each other and have a second overlapping area, the first electrode block and the second electrode block that are adjacent to each other and arranged in different layers overlap with each other, have a third overlapping area and are electrically connected with each other by a contact window.

12. A method for manufacturing the semiconductor structure according to claim 1, comprising:

providing an electrode layer of the at least two electrode layers;

forming the dielectric layer, the dielectric layer covering the electrode layer of the at least two electrode layers, and the air gap being arranged in the dielectric layer; and forming another electrode layer of the at least two electrode layers located on the dielectric layer, two adjacent electrode layers of the at least two electrode layers being parallel to each other and arranged in different layers, the two adjacent electrode layers overlapping with each other and having the overlapping area, the dielectric layer being arranged between the two adjacent electrode layers, and the air gap being arranged in the dielectric layer located in the overlapping area, wherein before forming the dielectric layer, the method further comprises forming a barrier layer on the electrode layer, wherein forming the dielectric layer comprises:

forming a plurality of annular side walls on the barrier layer, the plurality of annular side walls being arranged on the barrier layer and interval arranged; and forming the filling layer on the barrier layer, the filling layer covering the plurality of annular side walls and extending into the plurality of annular side walls and to be between adjacent annular side walls of the plurality of annular side walls, the dielectric layer comprising the plurality of annular side walls and the filling layer covering the plurality of annular side walls, and the air gap being arranged in the part in the filling layer located in each of the plurality of annular side walls and the part located between the adjacent annular side walls.

13. The method for manufacturing the semiconductor structure of claim 12, wherein before forming the dielectric layer, the method further comprises: forming a buffer layer on the barrier layer.

14. The method for manufacturing the semiconductor structure of claim 13, wherein forming the dielectric layer comprises:

forming the plurality of annular side walls on the buffer layer, the plurality of annular side walls being arranged on the buffer layer and interval arranged; and forming the filling layer on the buffer layer, the filling layer covering the plurality of annular side walls and extending into the plurality of annular side walls and to be between the adjacent annular side walls.

15. The method for manufacturing the semiconductor structure of claim 12, wherein a material of the barrier layer comprises at least one of silicon nitride or silicon carbon nitride.

\* \* \* \* \*